United States Patent
Wu et al.

(10) Patent No.: US 8,866,529 B2
(45) Date of Patent: Oct. 21, 2014

(54) INTERFACE CIRCUIT (71) Applicant: Novatek Microelectronics Corp., Hsinchu (TW)

(72) Inventors: Tse-Hung Wu, New Taipei (TW); Chao-Kai Tu, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/786,589

(22) Filed: Mar. 6, 2013

(65) Prior Publication Data
US 2014/0097889 A1 Apr. 10, 2014

(30) Foreign Application Priority Data
Oct. 9, 2012 (TW) .............................. 101137295 A (51) Int. Cl.
*H03K 5/08* (2006.01)
*G05F 3/08* (2006.01)

(52) U.S. Cl.
CPC ........................................ *G05F 3/08* (2013.01)
USPC .......................................................... 327/320

(58) Field of Classification Search
USPC .......................................... 327/318, 319, 320
See application file for complete search history.

(56) References Cited

U.S. PATENT DOCUMENTS

| 7,750,666 | B2 * | 7/2010 | Zhang et al. | 326/30 |
| 8,319,579 | B2 * | 11/2012 | Zhuang et al. | 333/28 R |
| 8,466,709 | B2 * | 6/2013 | Nguyen | 326/30 |
| 8,466,712 | B1 * | 6/2013 | Avitan et al. | 326/127 |

* cited by examiner

*Primary Examiner* — Jeffrey Zweizig
(74) *Attorney, Agent, or Firm* — Rabin & Berdo, P.C.

(57) ABSTRACT

An interface circuit includes a receiver, a first terminal resistor, a second terminal resistor, a common mode capacitor, a first switch, a second switch, and a common mode potential adjustment circuit. The receiver includes a first channel for receiving a first channel voltage, and a second channel for receiving a second channel voltage. The common mode capacitor provides a common mode potential. The first switch electrically connects the first terminal resistor to the common mode capacitor, and the second switch electrically connects the second terminal resistor to the common mode capacitor. The common mode potential adjustment circuit is coupled to the first switch, the second switch and the common mode capacitor, and adjusts the common mode potential according to the first channel voltage and the second channel voltage.

11 Claims, 7 Drawing Sheets

INTERFACE CIRCUIT

This application claims the benefit of Taiwan application Serial No. 101137295, filed Oct. 9, 2012, the subject matter of which is incorporated herein by reference.

BACKGROUND OF THE INVENTION

1. Field of the Invention

The invention relates in general to a circuit, and more particularly to an interface circuit.

2. Description of the Related Art

Figure 1:
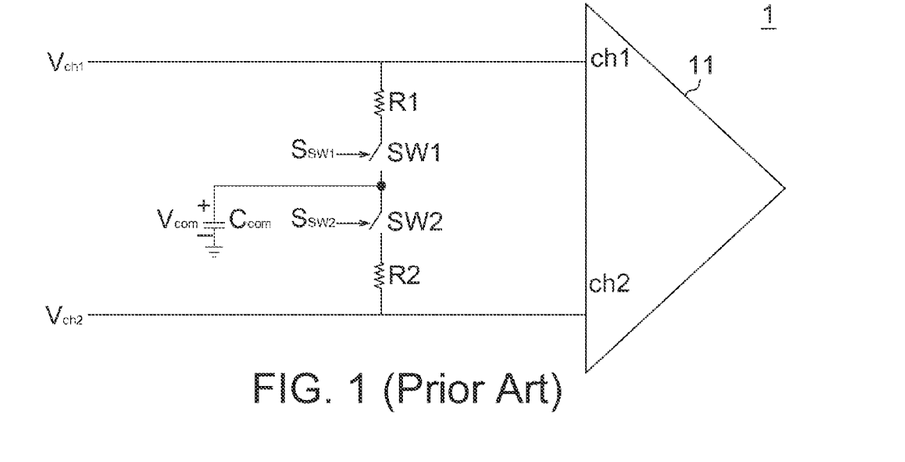
FIG. 1 is a circuit diagram of a conventional interface circuit.
Figure 2:
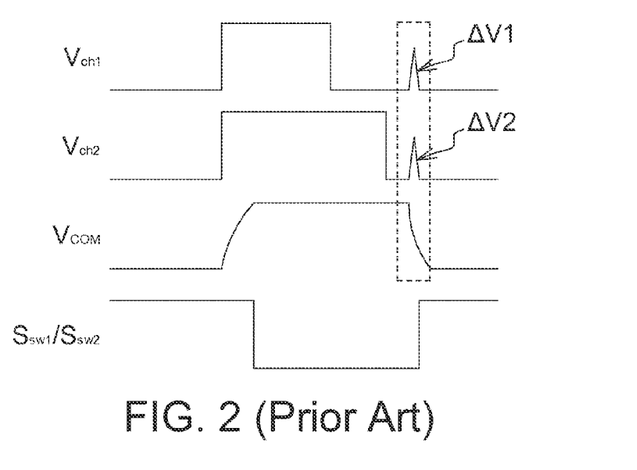
FIG. 2 is a timing diagram of associated signals in a conventional interface circuit.

FIG. 1 shows a schematic diagram of a conventional interface circuit; FIG. 2 shows a timing diagram of associated signals in the conventional interface circuit. Referring to FIGS. 1 and 2, a conventional interface circuit 1 includes a receiver 11, a common mode capacitor $C_{com}$, a terminal resistor R1, a terminal resistor R2, a switch SW1 and a switch SW2. The receiver 11 has a channel ch1 and a channel ch2. The switches SW1 and SW2 are respectively controlled by switch control signals $S_{SW1}$ and $S_{SW2}$ to couple the terminal resistors R1 and R2 to the common mode capacitor $C_{com}$. At the instant when the switches SW1 and SW2 are turned on, noises $\Delta V1$ and $\Delta V2$ are produced at the channels ch1 and ch2 due to instantaneous discharge of the common mode capacitor $C_{com}$.

SUMMARY OF THE INVENTION

The invention is directed to an interface circuit.

According to an aspect of the present invention, an interface circuit is provided. The interface circuit includes a receiver, a first terminal resistor, a second terminal resistor, a common mode capacitor, a first switch, a second switch, and a common mode potential adjustment circuit. The receiver includes a first channel for receiving a first channel voltage, and a second channel for receiving a second channel voltage. The common mode capacitor provides a common mode potential. The first switch electrically connects the first terminal resistor to the common mode capacitor, and the second switch electrically connects the second terminal resistor to the common mode capacitor. The common mode potential adjustment circuit is coupled to the first switch, the second switch and the common mode capacitor, and adjusts the common mode potential according to the first channel voltage and the second channel voltage.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 3:
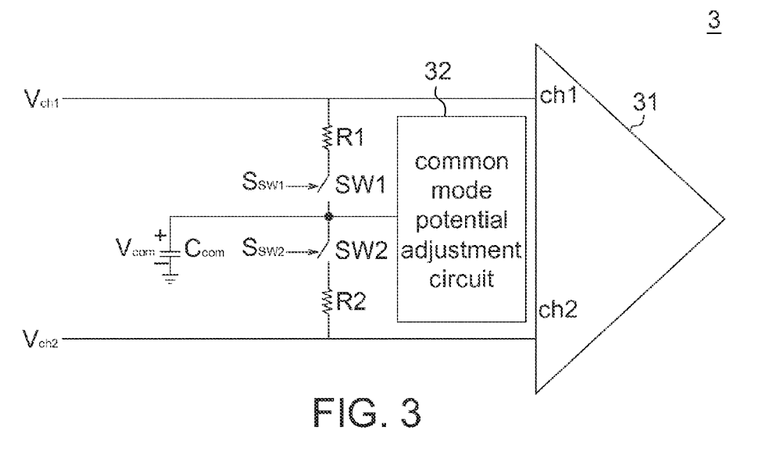
FIG. 3 is a schematic diagram of an interface circuit.

FIG. 3 shows a schematic diagram of an interface circuit according to one embodiment. An interface circuit 3 is operable under a large-voltage swing, low-speed and low-power signal mode, or a low-voltage swing and high-speed differential signal mode. The interface circuit 3 includes a receiver 31, a common mode capacitor $C_{com}$, a terminal resistor R1, a terminal resistor R2, a switch SW1, a switch SW2 and a common mode potential adjustment circuit 32. Under the high-speed differential mode, the switch SW1 and the switch SW2 are respectively controlled by a switch control signal $S_{SW1}$ and a switch control signal $S_{SW2}$ to electrically connect the terminal resistor R1 and the terminal resistor R2 to the common mode capacitor $C_{com}$ that provides a common mode potential $V_{com}$.

The receiver 31 has a channel ch1 and a channel ch2. The channel ch1 receives a channel voltage $V_{ch1}$, and the channel ch2 receives a channel voltage $V_{ch2}$. Under the high-speed differential signal mode, the channel voltages $V_{ch1}$ and $V_{ch2}$ serve as differential signals. The common mode potential adjustment circuit 32 is coupled to the switch SW1, the switch SW2 and the common mode capacitor $C_{com}$, and adjusts the common mode potential $V_{com}$ according to the channel voltages $V_{ch1}$ and $V_{ch2}$, so as to suppress noises generated at the instant that the switch SW1 or the switch SW2 is turned on.

First Embodiment

Figure 4:
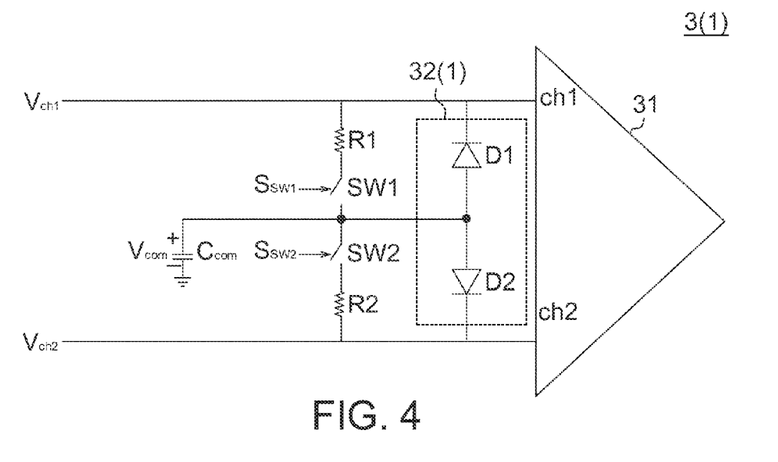
FIG. 4 is a schematic diagram of an interface circuit according to a first embodiment.
Figure 5:
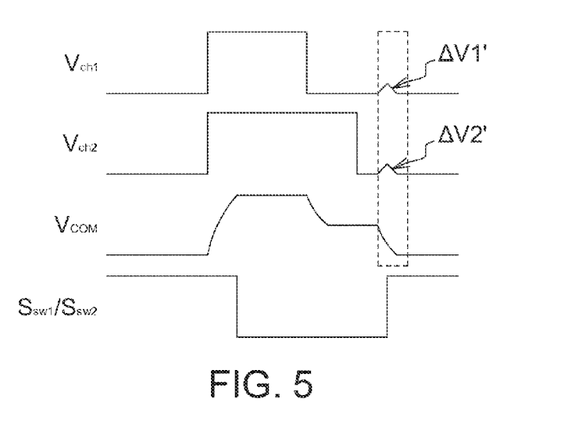
FIG. 5 is a timing diagram of associated signals according to the first embodiment.

FIG. 4 shows a schematic diagram of an interface circuit according to a first embodiment; FIG. 5 shows a timing diagram of associated signals according to the first embodiment. Referring to FIGS. 4 and 5, in the first embodiment, the common mode potential adjustment circuit 32 is exemplified by a common mode potential adjustment circuit 32(1). The common mode potential adjustment circuit 32(1) includes a diode D1 and a diode D2. The diode D1 has a cathode coupled to the channel ch1. The diode D2 has an anode coupled to an anode of the diode D1, the switch SW1, the switch SW2 and the common mode capacitor $C_{com}$, and has a cathode coupled to the channel ch2.

When the channel voltage $V_{ch1}$ changes from a high potential to a low potential, the diode D1 is turned on. The diode D1 provides a discharge path between the common mode capacitor $C_{com}$ and the channel ch1, such that the common mode potential $V_{com}$ starts to lower. When the channel voltage Vch2 subsequently changes from a high potential to a low potential, the diode D2 is turned on. The diode D2 provides another discharge between the common mode capacitor $C_{com}$ and the channel ch2, such that the common mode potential $V_{com}$ further lowers.

Before the switches SW1 and SW2 are turned on, the common mode capacitor $C_{com}$ adjusts the common mode potential $V_{com}$ by discharging via the diode D1 and the diode D2. Thus, noises ΔV1' and ΔV2' generated at the channels ch1 and ch2 at the instant that the switches SW1 and SW2 are turned on can be suppressed.

Second Embodiment

Figure 6:
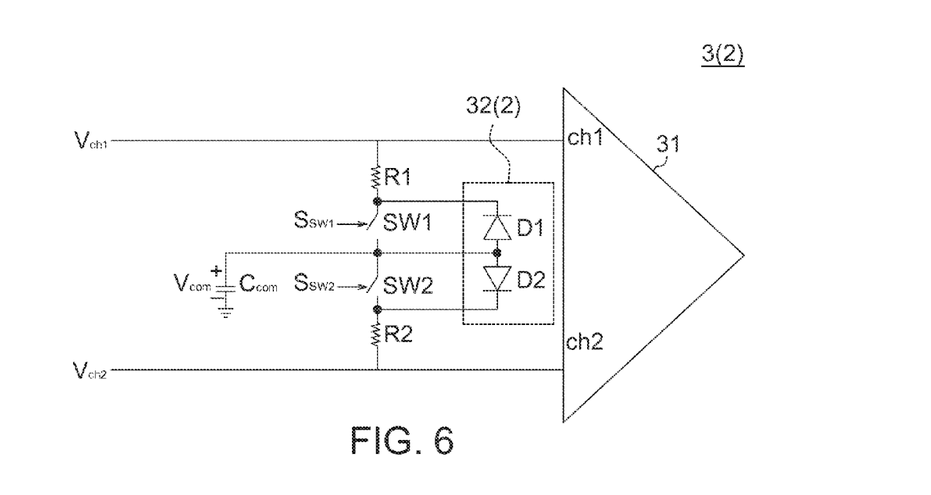
FIG. 6 is a schematic diagram of an interface circuit according to a second embodiment.

FIG. 6 shows a schematic diagram of an interface circuit according to a second embodiment. Referring to FIG. 6, in the second embodiment, the interface circuit 3 is exemplified by an interface circuit 3(2), and the common mode potential adjustment circuit 32 is exemplified by a common mode potential adjustment circuit 32(2). A main difference of the second embodiment from the first embodiment is that, the cathode of the diode D1 of the common mode potential adjustment circuit 32(2) is coupled to a connecting point of the terminal resistor R1 and the switch SW1, and the cathode of the diode D2 of the common mode potential adjustment circuit 32(2) is coupled to a connecting point of the terminal resistor R2 and the switch SW2.

Third Embodiment

Figure 7:
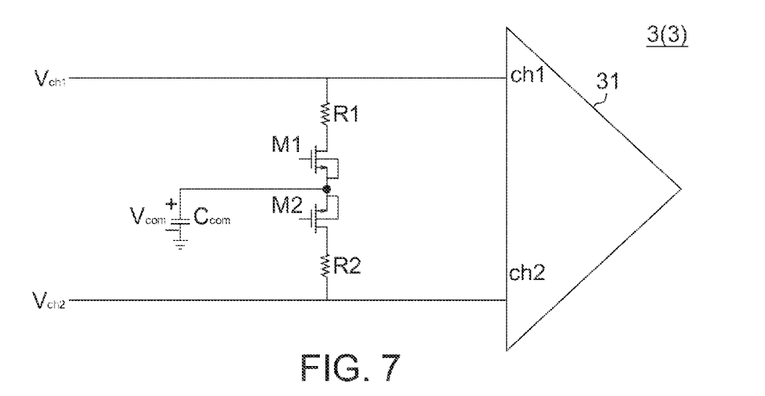
FIG. 7 is a schematic diagram of an interface circuit according to a third embodiment.

FIG. 7 shows a schematic diagram of an interface circuit according to a third embodiment. In the third embodiment, the foregoing interface circuit 3 is exemplified by an interface circuit 3(3). Referring to FIGS. 6 and 7, a main difference of the third embodiment from the second embodiment is that, in the interface circuit 3(3), the switch SW1 and the diode D1 of the common mode potential adjustment circuit 32(2) are implemented by a field-effect transistor M1, and the switch SW2 and the diode D2 of the common mode potential adjustment circuit 32(2) are implemented by a field-effect transistor M2. For example, the field-effect transistor M1 and the field-effect transistor M2 are N-type metal-oxide-semiconductor field-effect transistors (MOSFETs).

The field-effect transistor M1 has a source and a body coupled to the common mode capacitor $C_{com}$ and a drain coupled to the terminal resistor R1, such that a discharge path substantial to the foregoing discharge path of the diode D1 is formed between the source and the drain of the field-effect transistor M1. Similarly, the field-effect transistor M2 has a source and a body coupled to the common mode capacitor $C_{com}$ and a drain coupled to the terminal resistor R2, such that a discharge path substantial to the foregoing discharge path of the diode D2 is formed between the source and the drain of the field-effect transistor M2.

Fourth Embodiment

Figure 8:
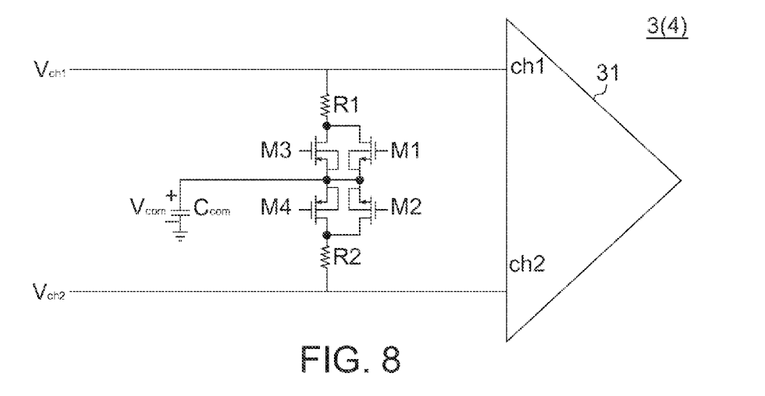
FIG. 8 is a schematic diagram of an interface circuit according to a fourth embodiment.

FIG. 8 shows a schematic diagram of an interface circuit according to a fourth embodiment. In the fourth embodiment, the foregoing interface circuit 3 is exemplified by an interface circuit 3(4). Referring to FIGS. 7 and 8, a main difference of the fourth embodiment from the third embodiment is that, the interface circuit 3(4) further includes a field-effect transistor M3 and a field-effect transistor M4. For example, the field-effect transistor M3 and the field-effect transistor M4 are P-type MOSFETs. The field-effect transistor M3 has a source and a body coupled to the common mode capacitor $C_{com}$, and a drain coupled to the terminal resistor R1. Similarly, the field-effect transistor M4 has a source and a body coupled to the common mode capacitor $C_{com}$, and a drain coupled to the terminal resistor R2.

Fifth Embodiment

Figure 9:
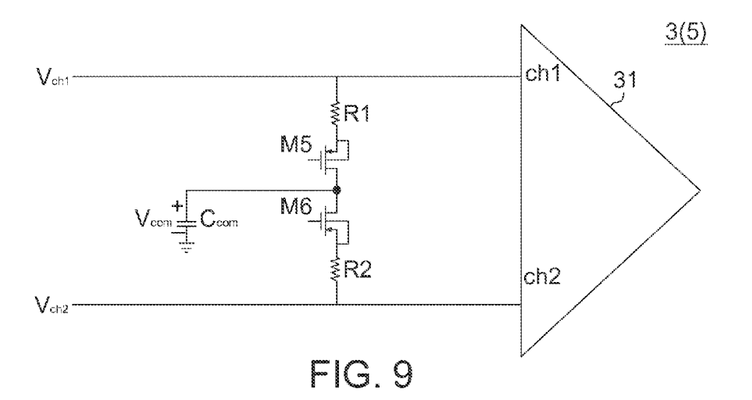
FIG. 9 is a schematic diagram of an interface circuit according to a fifth embodiment.

FIG. 9 shows a schematic diagram of an interface circuit according to a fifth embodiment. In the fifth embodiment, the foregoing interface circuit 3 is exemplified by an interface circuit 3(5). Referring to FIGS. 6 and 9, a main difference of the fifth embodiment from the second embodiment is that, in the interface circuit 3(5), the switch SW1 and the diode D1 of the common mode potential adjustment circuit 32(2) are implemented by a field-effect transistor M5, and the switch SW2 and the diode D2 of the common mode potential adjustment circuit 32(2) are implemented by a field-effect transistor M6. For example, the field-effect transistor M5 and the field-effect transistor M6 are P-type MOSFETs.

The field-effect transistor M5 has a source and a body coupled to the terminal resistor R1, and a drain coupled to the common mode capacitor $C_{com}$, such that a discharge path substantial to the foregoing discharge path of the diode D1 is formed between the source and the drain of the field-effect transistor M5. Similarly, the field-effect transistor M2 has a source and a body coupled to the terminal resistor R2, and a drain coupled to the common mode capacitor $C_{com}$, such that a discharge path substantial to the foregoing discharge path of the diode D2 is formed between the source and the drain of the field-effect transistor M6.

Sixth Embodiment

Figure 10:
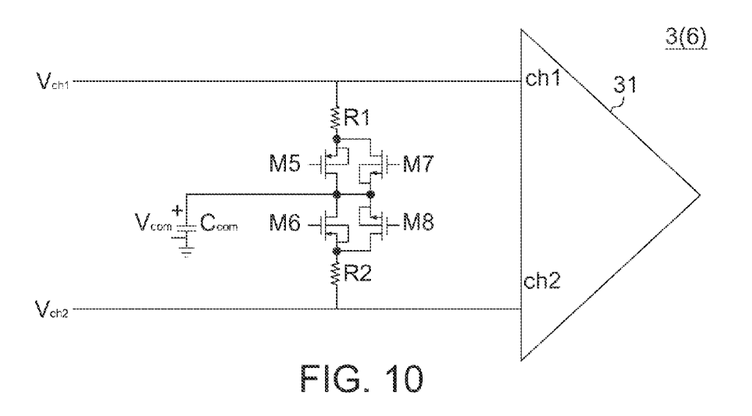
FIG. 10 is a schematic diagram of an interface circuit according to a sixth embodiment.

FIG. 10 shows a schematic diagram of an interface circuit according to a sixth embodiment. In the sixth embodiment, the foregoing interface circuit 3 is exemplified by an interface circuit 3(6). Referring to FIGS. 9 and 10, a main difference of the sixth embodiment from the fifth embodiment is that, the interface circuit 3(6) further includes a field-effect transistor M7 and a field-effect transistor M8. For example, the field-effect transistor M7 and the field-effect transistor M8 are N-type MOSFETs. The field-effect transistor M7 has a source and a body coupled to the common mode capacitor $C_{com}$, and a drain coupled to the terminal resistor R1. Similarly, the field-effect transistor M8 has a source and a body coupled to the common mode capacitor $C_{com}$, and a drain coupled to the terminal resistor R2.

Seventh Embodiment

Figure 11:
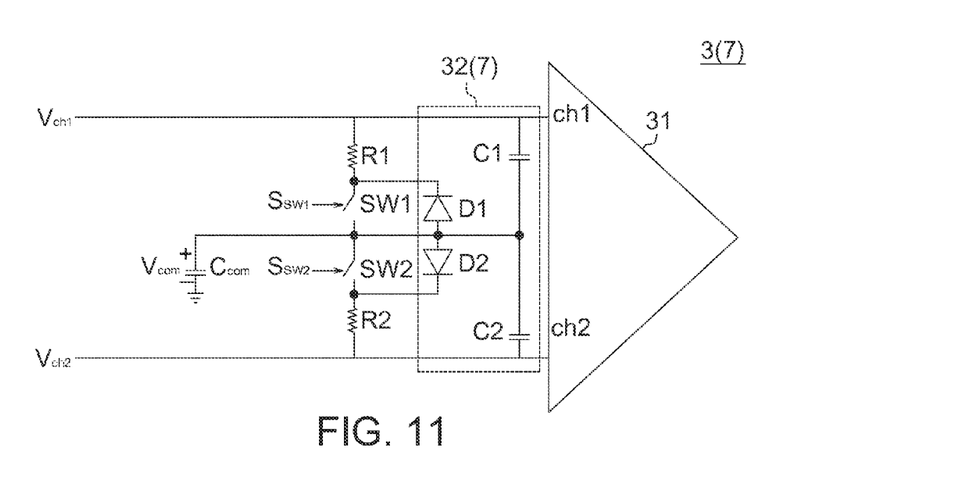
FIG. 11 is a schematic diagram of an interface circuit according to a seventh embodiment.

FIG. 11 shows a schematic diagram of an interface circuit according to a seventh embodiment. In the seventh embodiment, the foregoing interface circuit 3 is exemplified by an interface circuit 3(7), and the common mode potential adjustment circuit 32 is exemplified by a common mode potential adjustment circuit 32(7). Referring to FIGS. 6 and 11, a main difference of the seventh embodiment from the second embodiment is that, the common mode potential adjustment circuit 32(7) further includes a capacitor C1 and a capacitor C2. The capacitor C1 has one end coupled to the channel ch1. The capacitor C2 has one end coupled to the channel ch2, and the other end coupled to the other end of the capacitor C1 and the common mode capacitor $C_{com}$.

When the channel voltage $V_{ch1}$ changes from a high potential to a low potential, the diode D1 is turned on. The common mode capacitor $C_{com}$ is discharged via the diode D1 and the capacitor C1, such that the common voltage potential $V_{com}$ starts to lower. When the channel voltage $V_{ch2}$ subsequently changes from a high potential to a low potential, the diode D2 is turned on. The common mode capacitor $C_{com}$ is discharged via the diode D2 and the capacitor C2, such that the common voltage potential $V_{com}$ further lowers.

Eighth Embodiment

Figure 12:
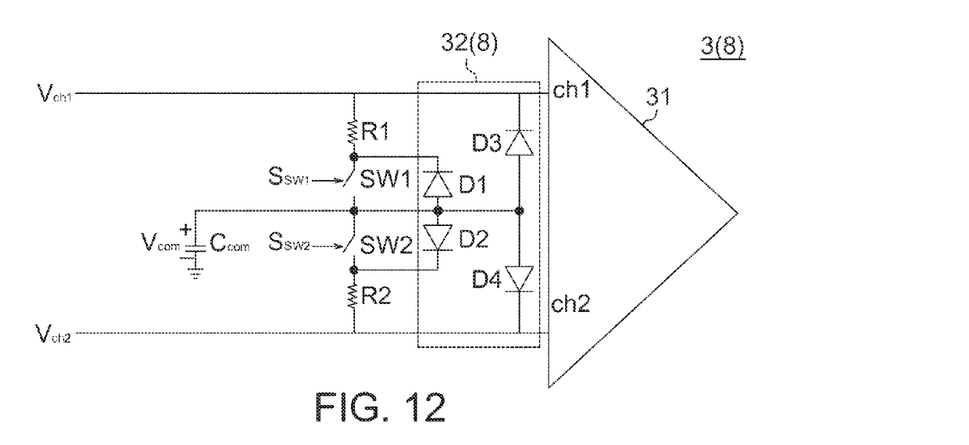
FIG. 12 is a schematic diagram of an interface circuit according to an eighth embodiment.

FIG. 12 shows a schematic diagram of an interface circuit according to an eighth embodiment. In the eighth embodiment, the foregoing interface circuit 3 is exemplified by an interface circuit 3(8), and the common mode potential adjustment circuit 32 is exemplified by a common mode potential adjustment circuit 32(8). Referring to FIGS. 6 and 12, a main difference of the eighth embodiment from the second embodiment is that, the common mode potential adjustment circuit 32(8) further includes a diode D3 and a diode D4. The diode D3 has a cathode coupled to the channel ch1. The diode D4 has a cathode coupled to the channel ch2, and an anode coupled to an anode of the diode D3 and the common mode capacitor $C_{com}$.

When the channel voltage $V_{ch1}$ changes from a high potential to a low potential, the diode D1 and the diode D3 are turned on. The common mode capacitor $C_{com}$ is discharged via the diode D1 and the diode D3, such that the common voltage potential $V_{com}$ starts to lower. When the channel voltage $V_{ch2}$ subsequently changes from a high potential to a low potential, the diode D2 and the diode D4 are turned on. The common mode capacitor $C_{com}$ is also discharged via the diode D2 and the diode D4, such that the common voltage potential $V_{com}$ further lowers.

Ninth Embodiment

Figure 13:
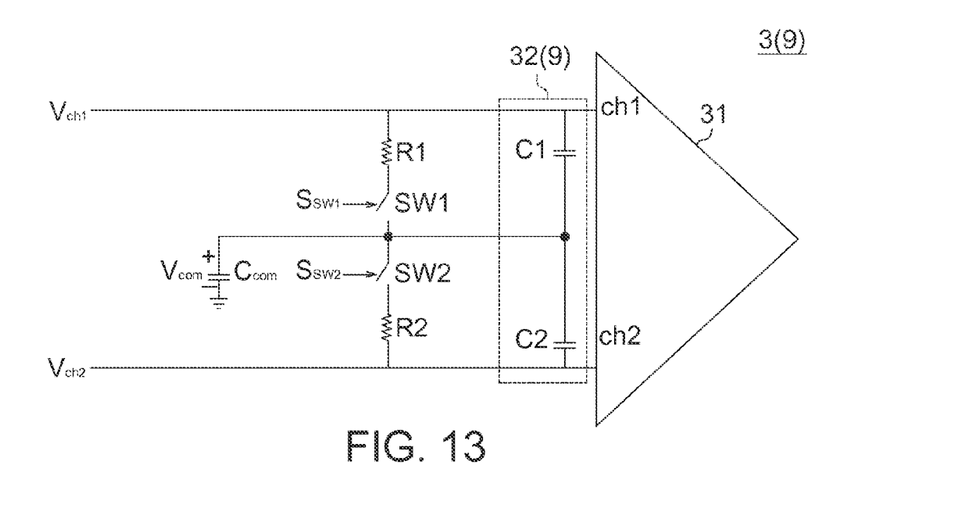
FIG. 13 is a schematic diagram of an interface circuit according to a ninth embodiment.

FIG. 13 shows a schematic diagram of an interface circuit according to a ninth embodiment. In the ninth embodiment, the foregoing interface circuit 3 is exemplified by an interface circuit 3(9), and the common mode potential adjustment circuit 32 is exemplified by a common mode potential adjustment circuit 32(9). Referring to FIGS. 6 and 13, a main difference of the ninth embodiment from the second embodiment is that, the common capacitor C2. The capacitor C1 has one end coupled to the channel ch1. The capacitor C2 has one end coupled to the channel ch2, and the other end coupled to the other end of the capacitor C1 and the common mode capacitor $C_{com}$.

When the channel voltage $V_{ch1}$ changes from a high potential to a low potential, the common mode capacitor $C_{com}$ is discharged via the capacitor C1, such that the common voltage potential $V_{com}$ starts to lower. When the channel voltage $V_{ch2}$ subsequently changes from a high potential to a low potential, the common mode capacitor $C_{com}$ is also discharged via the capacitor C2, such that the common voltage potential $V_{com}$ further lowers.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An interface circuit, comprising:
    a receiver, comprising:
        a first channel, for receiving a first channel voltage; and
        a second channel, for receiving a second channel voltage;
    a first terminal resistor;
    a second terminal resistor;
    a common mode capacitor, for providing a common mode potential;
    a first switch, for electrically connecting the first terminal resistor to the common mode capacitor;
    a second switch, for electrically connecting the second terminal resistor to the common mode capacitor; and
    a common mode potential adjustment circuit, coupled to the first switch, the second switch and the common mode capacitor, for adjusting the common mode potential according to the first channel voltage and the second channel voltage.

2. The interface circuit according to claim 1, wherein the common mode potential adjustment circuit comprises:
    a first diode, having a cathode coupled to the first channel; and
    a second diode, having an anode coupled to an anode of the first diode, the first switch, the second switch and the common mode capacitor, and a cathode coupled to the second channel.

3. The interface circuit according to claim 1, wherein the common mode potential adjustment circuit comprises:
    a first diode, having a cathode coupled to the first terminal resistor and the first switch; and
    a second diode, having an anode coupled to an anode of the first diode and the common mode capacitor, and a cathode coupled to the second terminal resistor and the second switch.

4. The interface circuit according to claim 3, wherein the common mode potential adjustment circuit further comprises:
    a first capacitor, having a first end coupled to the first channel; and
    a second capacitor, having a first end coupled to the second channel, and a second end coupled to a second end of the first capacitor and the common mode capacitor.

5. The interface circuit according to claim 3, wherein the common mode potential adjustment circuit further comprises:
    a third diode, having a cathode coupled to the first channel; and
    a fourth diode, having a cathode coupled to the second channel, and an anode coupled to an anode of the third diode and the common mode capacitor.

6. The interface circuit according to claim 3, wherein the first switch and the first diode are implemented as a singular first field-effect transistor, and the second switch and the second diode are implemented as a singular second field-effect transistor.

7. The interface circuit according to claim 6, wherein the first field-effect transistor has a source and a body coupled to the common mode capacitor, and a drain coupled to the first terminal resistor; the second field-effect transistor has a source and a body coupled to the common mode capacitor, and a drain coupled to the second terminal resistor.

8. The interface circuit according to claim 7, wherein the common mode potential adjustment circuit further comprises:
    a third field-effect transistor, having a source and a body coupled to the common mode capacitor, and a drain coupled to the first terminal resistor; and
    a fourth field-effect transistor, having a source and a body coupled to the common mode capacitor, and a drain coupled to the second terminal resistor.

9. The interface circuit according to claim 6, wherein the first field-effect transistor has a source and a body coupled to the first terminal resistor, and a drain coupled to the common mode capacitor; the second field-effect transistor has a source and a body coupled to the second terminal resistor, and a drain coupled to the common mode capacitor.

10. The interface circuit according to claim 9, wherein the common mode potential adjustment circuit further comprises:
    a third field-effect transistor, having a source and a body coupled to the common mode capacitor, and a drain coupled to the first terminal resistor; and
    a fourth field-effect transistor, having a source and a body coupled to the common mode capacitor, and a drain coupled to the second terminal resistor.

11. The interface circuit according to claim 1, wherein the common mode potential adjustment circuit further comprises:
    a first capacitor, having a first end coupled to the first channel; and a second capacitor, having a first end coupled to the second channel, and a second end coupled to a second end of the first capacitor and the common mode capacitor.

* * * * *